(12) United States Patent
Lee et al.

(10) Patent No.: US 9,537,458 B2
(45) Date of Patent: Jan. 3, 2017

(54) FEEDBACK AMPLIFIER

(71) Applicant: ELECTRONICS AND TELECOMMUNICATIONS RESEARCH INSTITUTE, Daejeon (KR)

(72) Inventors: Sang Heung Lee, Daejeon (KR); Dong Min Kang, Daejeon (KR); Seong Il Kim, Daejeon (KR); Ho Kyun Ahn, Daejeon (KR); Hyung Sup Yoon, Daejeon (KR); Jong Won Lim, Daejeon (KR); Chull Won Ju, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/666,163

(22) Filed: Mar. 23, 2015

(65) Prior Publication Data

US 2015/0349736 A1      Dec. 3, 2015

(30) Foreign Application Priority Data

Jun. 3, 2014      (KR) .................. 10-2014-0067490

(51) Int. Cl.
*H03F 3/08* (2006.01)
*H03G 1/00* (2006.01)
(Continued)

(52) U.S. Cl.
CPC ............ *H03G 1/0088* (2013.01); *H03F 1/083* (2013.01); *H03F 3/08* (2013.01); *H03F 2200/153* (2013.01); *H03G 3/12* (2013.01)

(58) Field of Classification Search
CPC ........... H03G 1/0088; H03G 1/00; H03F 3/16; H03F 2200/153; H04Q 11/00; H04Q 11/0005; H04Q 2011/0013
(Continued)

(56) References Cited

U.S. PATENT DOCUMENTS

| 5,952,887 | A | 9/1999 | Katayanagi et al. |
| 7,157,977 | B2 * | 1/2007 | Lee ............................ H03F 1/34 |
| | | | 330/308 |

(Continued)

FOREIGN PATENT DOCUMENTS

| JP | 10-242773 A | 9/1998 |
| KR | 10-0802518 B1 | 2/2008 |

(Continued)

*Primary Examiner* — Khanh V Nguyen
(74) *Attorney, Agent, or Firm* — Rabin & Berdo, P.C.

(57) ABSTRACT

Provided herein is a feedback amplifier including an amplifier circuit configured to amplify an input signal input from an input terminal and output the amplified input signal to an output terminal; a feedback circuit configured to apply a feedback resistance value to a signal output to the output terminal, and to control a gain of the amplifier circuit by adjusting the input signal by a bias voltage applied with a feedback resistance value determined; a packet signal sensor configured to generate a fixed resistance control signal for controlling a fixed resistance value included in the feedback resistance value through a comparison between the output from the output terminal with a minimum signal level; and a fixed resistance controller configured to control the fixed resistance value included in the feedback resistance value in response to the fixed resistance control signal.

11 Claims, 5 Drawing Sheets

(51) Int. Cl.
*H03F 1/08* (2006.01)
*H03G 3/12* (2006.01)

(58) Field of Classification Search
USPC .................. 330/59, 86, 278.279, 282, 308
See application file for complete search history.

(56) References Cited

U.S. PATENT DOCUMENTS

| | | | | |
|---|---|---|---|---|
| 8,421,538 | B2* | 4/2013 | Lee | H03F 1/34 |
| | | | | 330/308 |
| 8,841,969 | B2* | 9/2014 | Lee | H03G 1/0082 |
| | | | | 330/282 |
| 9,178,474 | B2* | 11/2015 | Lee | H03G 3/3084 |
| 2009/0051442 | A1* | 2/2009 | Seo | H03F 3/087 |
| | | | | 330/308 |

FOREIGN PATENT DOCUMENTS

| | | |
|---|---|---|
| KR | 2012-0061155 A | 6/2012 |
| KR | 2013-0077432 A | 7/2013 |

* cited by examiner

FEEDBACK AMPLIFIER

CROSS-REFERENCE TO RELATED APPLICATION

The present application claims priority to Korean patent application number 10-2014-0067490, filed on Jun. 3, 2014, the entire disclosure of which is incorporated herein in its entirety by reference.

BACKGROUND

Field of Invention

Various embodiments of the present invention relate to an optical communication system, and more particularly, to a feedback amplifier that is capable of sensing an input signal, and controlling a gain of an amplifier.

Description of Related Art

Optical access networks are evolving into optical multiple access networks that use the PON (Passive Optical Network) technology. In such a passive optical network, bust mode optical signals are used. When a bust mode optical signal converts from a packet of a channel to a packet of another channel, the voltage of the optical signal suddenly changes significantly.

An optical receiver of an optical communication system needs both a wide dynamic range and high receiving sensitivity. In such an optical receiver, a preamplifier is positioned at a first terminal where a signal is input, and the performance of the preamplifier depends on the performance of a feedback amplifier that is used as the preamplifier.

Such a feedback amplifier has an amplifier circuit for sensing a bust packet input signal and for amplifying the same. The feedback amplifier provides a feedback circuit for sensing a peak value of the bust packet input signal and for controlling the level of the output voltage of the sensed signal. Herein, the feedback circuit includes a feedback resistance connected between an input terminal and output terminal, and a feedback transistor in parallel to the feedback resistance. Herein, the feedback transistor may control the current flowing through the feedback circuit and the output voltage as a control signal is applied to its base.

Such a feedback amplifier senses a bust packet input signal by the voltage level, but it cannot sense a bust packet input signal when the voltage level of the bust packet input signal is extremely low, which is a problem.

Furthermore, for applying a control signal to the base of the feedback transistor, there is a method of configuring a separate gain control signal generating circuit outside the feedback amplifier to generate a control signal, and a method of positioning a bias circuit inside the feedback amplifier to generate a control signal in itself. However, since the control signal changes in response to the input signal, if there is a big difference in the input signal, it is not possible to freely control the gain of the preamplifier, which is a problem.

SUMMARY

A purpose of various embodiments of the present invention is to provide a feedback amplifier that is capable of sensing a signal having a small level size.

Another purpose of various embodiments of the present invention is to provide a feedback amplifier that is capable of freely and automatically controlling the gain even if there is a big difference in the sensed input signal.

According to an embodiment of the present invention, there is provided a feedback amplifier including an amplifier circuit configured to amplify an input signal input from an input terminal and output the amplified input signal to an output terminal; a feedback circuit disposed between the input terminal and the output terminal, and configured to apply a feedback resistance value to a signal output to the output terminal, and to control a gain of the amplifier circuit by adjusting the input signal on the basis of a bias voltage applied with a feedback resistance value determined; a bias circuit configured to generate the bias voltage; a packet signal sensor configured to generate a fixed resistance control signal for controlling a fixed resistance value included in the feedback resistance value through a comparison between the output from the output terminal with a minimum signal level; and a fixed resistance controller configured to control the fixed resistance value included in the feedback resistance value in response to the fixed resistance control signal.

Herein, the feedback circuit may include a feedback transistor wherein its base receives the bias, its collector is connected to the input terminal, and its emitter is connected to the output terminal; a fixed resistance connected between the input terminal and the output terminal, and has the fixed resistance value; and at least one feedback resistance connected to the fixed resistance in parallel.

Herein, the fixed resistance controller may include a fixed resistance transistor made of a PNP bipolar transistor, and an emitter of the fixed resistance transistor may be connected to one end of the fixed resistance, a collector may be connected to another end of the fixed resistance, the fixed resistance control signal may be received through a base and whether or not to apply the fixed resistance value may be determined, or the collector may be connected to one end of the fixed resistance, the emitter may be connected to the another end of the fixed resistance, and the fixed resistance control signal may be received through the base and whether or not to apply the fixed resistance value may be determined.

Herein, the fixed resistance controller may include a fixed resistance transistor made of a PMOSFET, and a drain of the fixed resistance transistor may be connected to one end of the fixed resistance, a source may be connected to another end of the fixed resistance, and the fixed resistance control signal may be received through a gate and whether or not to apply the fixed resistance value may be determined, or the source may be connected to one end of the fixed resistance, the drain may be connected to another end of the fixed resistance, and the fixed resistance control signal may be received through the gate and whether or not to apply the fixed resistance value may be determined.

Herein, the packet signal sensor may include a comparator configured to compare an output from the output terminal with the minimum signal level, and in response to the output from the output terminal being bigger than the minimum signal level, to output the fixed resistance control signal having a HIGH output, and in response to the output from the output terminal being smaller than the minimum signal level, to output the fixed resistance control signal having a LOW output.

Herein, the feedback circuit may further include a feedback capacitor connected to at least one feedback resistance in parallel and configured to compensate a frequency response.

Herein, the packet signal sensor may include a comparator configured to compare an output from the output terminal with the minimum signal level, and in response to the output from the output terminal being bigger than the minimum signal level, to output the fixed resistance control signal having a HIGH output, and in response to the output from the output terminal being smaller than the minimum signal level, to output the fixed resistance control signal having a LOW output.

Herein, the feedback circuit may further include a feedback capacitor connected to at least one feedback resistance in parallel and configured to compensate a frequency response.

Herein, the feedback circuit may further include a feedback transistor connected to the at least one feedback resistance in series and configured to selectively determine whether or not to apply a resistance value of the feedback resistance connected in series as the feedback resistance value in response to a control signal applied to a base.

Herein, the feedback amplifier may further include a control signal generator configured to compare an output from the output terminal with a reference voltage level and generate the control signal.

Herein, the feedback amplifier may further include a comparator corresponding to the feedback transistor, and configured to compare an output from the output terminal with a reference voltage level, and in response to the output from the output terminal being bigger than the reference voltage level, to output the control signal having a HIGH output, and in response to the output from the output terminal being smaller than the reference voltage level, to output the control signal having a LOW output.

Herein, the amplifier circuit may include a first resistance connected to a power source voltage; a first transistor wherein its base is connected to the input terminal, its emitter is connected to a grounding terminal, and its collector is connected to the power source voltage through the first resistance; a second transistor wherein its base is connected to the collector of the first transistor, its collector is connected to the power source voltage, and its emitter is connected to the output terminal; and a second resistance connected between the output terminal and grounding terminal.

Herein, the amplifier circuit may include a phase compensation circuit configured to prevent a distortion of an output wave form from being caused by an increase of the feedback current amount between the amplifier circuit and the bias circuit.

Herein, the phase compensation circuit may include a compensation transistor wherein its collector is connected to a power source voltage, its base is connected to a collector of the second bias transistor, and its emitter is connected to a collector of the first transistor.

A feedback amplifier according to the aforementioned various embodiments of the present invention is capable of controlling a feedback resistance based on an output signal, thereby sensing a small size input signal, and freely and automatically controlling a gain even when there is a big difference in the sensed input signal.

BRIEF DESCRIPTION OF THE DRAWINGS

The above and other features and advantages of the present invention will become more apparent to those of ordinary skill in the art by describing in detail embodiments with reference to the attached drawings in which.

DETAILED DESCRIPTION

Hereinafter, embodiments will be described in greater detail with reference to the accompanying drawings. Embodiments are described herein with reference to cross-sectional illustrates that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first', and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present invention. Furthermore, 'and/or' may include any one of or a combination of the components mentioned.

Furthermore, 'connected' represents that one component is directly connected to another component or indirectly connected through another component. In this specification, a singular form may include a plural form as long as it is not specifically mentioned in a sentence.

In this specification, a singular form may include a plural form as long as it is not specifically mentioned in a sentence. Furthermore, 'include/comprise' or 'including/comprising' used in the specification represents that one or more components, steps, operations, and elements exist or are added.

Hereinafter, embodiments will be described based on an assumption that the optical network used herein is a PON (Passive Optical Network) system. According to an embodiment of the present invention, there is provided a feedback amplifier that is capable of sensing an input signal regardless of the size of a voltage level of the input signal (for example, bust packet signal) and controlling a gain even if there is a big difference in the size of the sensed input signal, in a passive optical network system. Such a feedback amplifier may for example be disposed inside an optical receiver.

Figure 1:
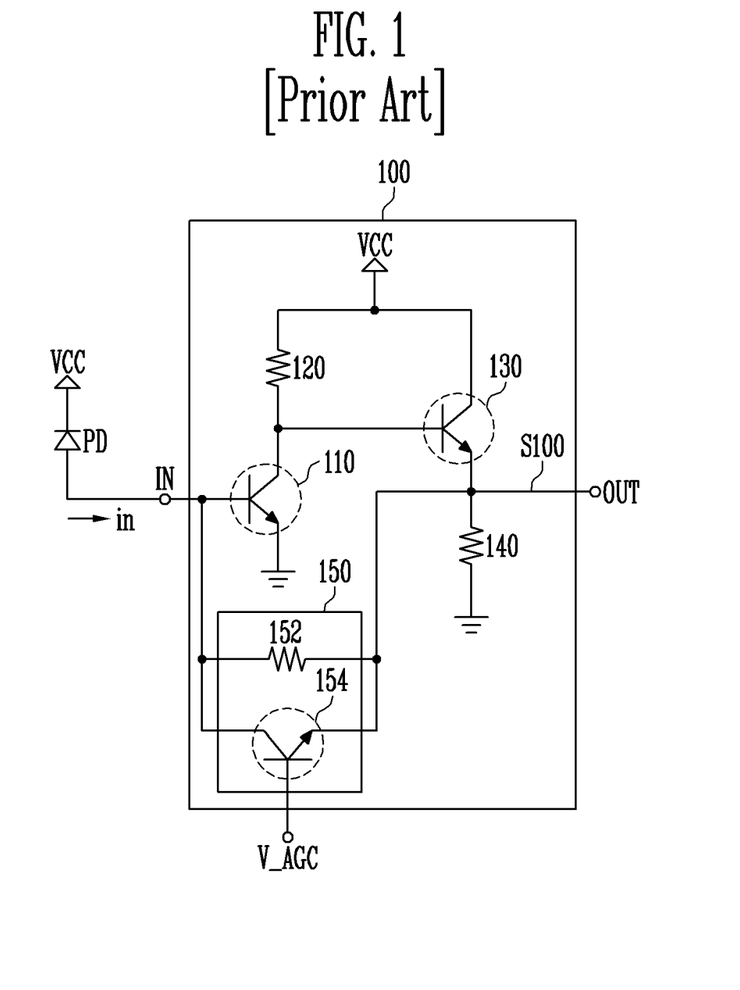
FIG. 1 is a view illustrating a general feedback amplifier.

FIG. 1 is a view illustrating a general feedback amplifier.
Referring to FIG. 1, the feedback amplifier 100 is connected between an input terminal (IN) and an output terminal (OUT).

The input terminal (IN) is connected to a photodiode (PD) connected to a power source (VCC). An input current (in) corresponding to a cathode current of the photodiode (PD) is supplied to the input terminal (IN).

The input terminal (IN) is connected to a base of a first NPN transistor 110. A collector of the first NPN transistor 110 is connected to the power source (VCC) and a base of a second NPN transistor 130 through a first resistance 120. A collector of the second NPN transistor 130 is connected to the power source (VCC), and an emitter of the second NPN transistor 130 is connected to the output terminal (OUT), and is connected to a grounding terminal through a second resistance 140. Furthermore, an emitter of the first NPN transistor 110 is also ground.

A feedback circuit 150 includes a feedback resistance 152 and feedback transistor 154. The output terminal (OUT) is connected to the base of the first NPN transistor 110 through the feedback resistance 152. An emitter of the feedback transistor 154 is connected to the output terminal (OUT), and a collector of the feedback transistor 154 is connected to the base of the first NPN transistor 110. To a base of the feedback transistor 154, a control signal (V_AGC) is applied from an external circuit (not illustrated) for controlling a feedback current.

In such a feedback amplifier 100, when a low voltage control signal (V_AGC) is applied to the base of the feedback transistor 154, an impedance between the collector and emitter of the feedback transistor 154 increases enough to place the feedback transistor 154 under an off condition. Therefore, the feedback transistor 154 is regarded to be equivalent to being open, and a transimpedance is regarded to be the same as the resistance value of the feedback resistance 152.

Then, when the control signal (V_AGC) increases, the feedback transistor 154 is turned on, reducing the impedance between the collector and emitter of the feedback transistor 154. As a result, the feedback resistance 152 and impedance are connected in parallel to each other, reducing the transimpedance. Therefore, the gain of the feedback amplifier 100 is controlled in response to the control signal (V_AGC).

That is, in the feedback amplifier 100, when the control signal (V_AGC) changes in response to an input current (in), the control signal (V_AGC) is determined based on the input current (in) within the range that the output voltage (S100) is not saturated. In order to supply such a control signal (V_AGC) with an appropriate signal value, it is necessary to configure an additional gain control signal generating circuit. And thus, the gain control signal generating circuit supplies the control signal (V_AGC) to the feedback amplifier 100.

However, in a conventional feedback amplifier, the gain is controlled merely by a turn on resistance of a feedback transistor, and thus it is not possible to sense a small input signal, nor freely control the gain when there is a big difference in the input signal.

Thus, hereinafter, feedback amplifiers will be proposed with reference to FIGS. 2 to 5 that are capable of detecting signals even when the size of the input signals are small, and of freely controlling the gain even when there is big difference in the input signal.

Figure 2:
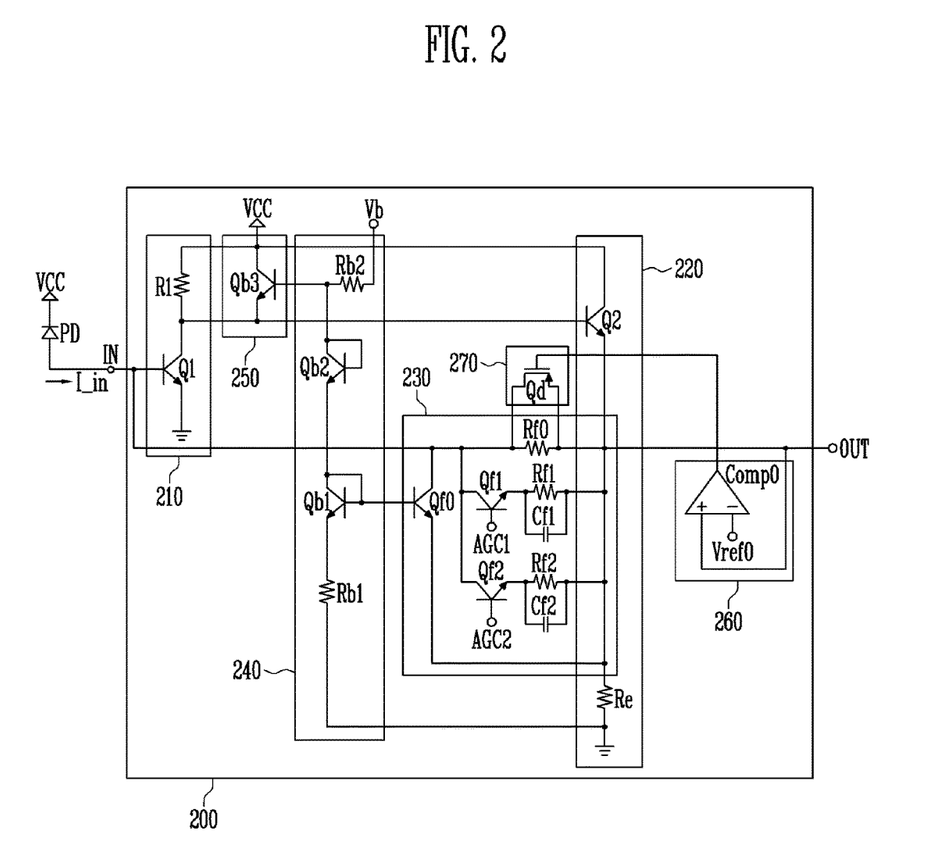
FIG. 2 is a view illustrating a feedback amplifier according to an embodiment of the present invention.

FIG. 2 is a view illustrating a feedback amplifier according to an embodiment of the present invention.

Referring to FIG. 2, the feedback amplifier 200 is connected between an input terminal (IN) and output terminal (OUT), and the input terminal (IN) is electrically connected to a power source (VCC), and a photodiode (PD) is connected between the input terminal (IN) and the power source (VCC). Accordingly, the photodiode (PD) detects an input voltage. Furthermore, a cathode current (I_in) of the photodiode (PD) becomes an input current (I_in) of the feedback amplifier 200, and the input current (I_in) is provided to the feedback amplifier 200 through the input terminal (IN).

The feedback amplifier 200 includes an amplifier circuit 210, output circuit 220, feedback circuit 230 and bias circuit 240, packet signal sensor 260, and fixed resistance controller 270. Furthermore, the feedback amplifier 200 may further include a phase compensation circuit 250.

The amplifier circuit 210 includes a first transistor (Q1) and a first resistance (R1), and the amplifier circuit 210 amplifies an input voltage input through the input terminal (IN) and generates an output voltage.

A base of the first transistor (Q1) is connected to the input terminal (IN), and a collector of the first transistor (Q1) is connected to the power source (VCC) through the first resistance (R1), and an emitter of the first transistor (Q1) is grounded. For example, an NPN bipolar transistor may be used as the first transistor (Q1).

The output circuit 220 includes a second transistor (Q2) and a second resistance (Re). The output circuit 220 outputs the output voltage generated in the amplifier circuit 210 through the output terminal (OUT).

A base of the second transistor (Q2) is connected to the collector of the first transistor (Q1), and a collector of the second transistor (Q2) is connected to the power source (VCC), and an emitter of the second transistor (Q2) is grounded through the second resistance (Re). For example, an NPN bipolar transistor may be used as the second transistor (Q2) just as in the first transistor (Q1).

The feedback circuit 230 includes a first feedback resistance (Rf0), first feedback transistor (Qf0), second feedback transistor (Qf1), second feedback resistance (Rf1), first feedback capacitor (Cf1), third feedback transistor (Qf2), third feedback resistance (Rf2), and second feedback capacitor (Cf2).

The first feedback resistance (Rf0) is connected between the input terminal (IN) and the output terminal (OUT).

The first feedback transistor (Qf0) is connected to the first feedback resistance (Rf0) in parallel. A base of the first feedback transistor (Qf0) is connected to the bias circuit 240, more specifically, to a base of the first bias transistor (Qb1) included in the bias circuit 240, that will be explained hereinafter, and the first feedback transistor (Qf0) receives a bias voltage (Vb) from the bias circuit 240. A collector of the first feedback transistor (Qf0) is connected to the input terminal (IN), and an emitter of the first feedback transistor (Qf0) is connected to the output terminal (OUT).

The second feedback transistor (Qf1) is connected to the first feedback resistance (Rf0) in parallel. A base of the second feedback transistor (Qf1) that adjusts the second feedback resistance (Rf1) value is connected to the control signal (AGC1), and a collector of the second feedback transistor (Qf1) is connected to the input terminal (IN), and an emitter of the second feedback transistor (Qf1) is connected to the second feedback resistance (Rf1).

The second feedback resistance (Rf1) is connected to the second feedback transistor (Qf1) in series.

The first feedback capacitor (Cf1) is connected to the second feedback resistance (Rf1) and second feedback resistance (Rf1) in parallel.

The third feedback transistor (Qf2) is connected to the first feedback resistance (Rf0) in parallel. A base of the third feedback transistor (Qf2) that adjusts a third feedback resistance (Rf2) is connected to the control signal (AGC2), and a collector of the third feedback transistor (Qf2) is connected to the input terminal (IN), and an emitter of the third feedback transistor (Qf2) is connected to the third feedback resistance (Rf2).

The third feedback resistance (Rf2) is connected to the third feedback transistor (Qf2) in series.

The second feedback capacitor (Cf2) is connected to the third feedback resistance (Rf2) in parallel.

The bias circuit 240 includes a first bias transistor (Qb1), second bias transistor (Qb2), first bias resistance (Rb1), and second bias resistance (Rb2). The bias circuit 240 supplies a bias voltage (Vb) to the feedback circuit 230, more specifically, to the first feedback transistor (Qf0) included in the feedback circuit 230.

A base and collector of the first bias transistor (Qb1) are connected to each other, and the base and collector connected to each other are connected to the base of the first feedback transistor (Qf0), and an emitter of the first bias transistor (Qb1) is grounded through the first bias resistance (Rb1).

Furthermore, a base and collector of the second bias transistor (Qb2) are connected to each other, and an emitter of the second bias transistor (Qb2) is connected to the collector of the first bias transistor (Qb1). Furthermore, a second bias resistance (Rb2) is connected between the collector of the second bias transistor (Qb2) and the bias voltage (Vb).

The phase compensation circuit 250 includes a phase compensation transistor (Qb3). For example, an NPN transistor may be used as the phase compensation transistor (Qb3).

A base of the phase compensation transistor (Qb3) is connected to the second bias resistance (Rb2), and a collector of the phase compensation transistor (Qb3) is connected to the power source (VCC), and an emitter of the phase compensation transistor (Qb3) is connected to the collector of the first transistor (Q1). Such a phase compensation circuit 250 prevents the output wave from being distorted due to an increase of the feedback current amount.

The packet signal sensor 260 receives an output from the output terminal (OUT) and determines whether or not it is a bust packet signal. The packet signal sensor 260 includes a first comparator (Comp0).

The first comparator (Comp0) receives an output (V_out) from the output terminal (OUT) and compares it with a minimum input level (Vref0) defined of the first comparator (Comp0).

The fixed resistance controller 270 receives an output of the first comparator (Comp0) of the packet signal sensor 260 and turns the fixed resistance (Rf0) off.

The fixed resistance controller 270 includes a fixed resistance transistor (Qd). In the case where the fixed resistance transistor (Qd) is a PNP bipolar transistor, a base of the fixed resistance transistor (Qd) is connected to the output of the first comparator (Comp0). A collector of the fixed resistance transistor (Qd) is connected to a contact point of the input terminal (IN) and the resistance (Rf0), and an emitter of the fixed resistance transistor (Qd) is connected to a contact point of the output terminal (OUT) and the resistance (Rf0). In the case where the fixed resistance transistor (Qd) is a PMOSFET (PMOS Field Effect Transistor), a gate of the fixed resistance transistor (Qd) is connected to the output of the first comparator (Comp0). A drain (or source) of the fixed resistance transistor (Qd) is connected to the contact point of the input terminal (IN) and the resistance (Rf0), and the source (or drain) of the fixed resistance transistor (Qd) is connected to the contact point of the output terminal (OUT) and the resistance (Rf0).

Hereinafter, an operation of a feedback amplifier 200 for an auto gain control operation of a feedback circuit 230 according to an embodiment of the present invention will be explained.

The second feedback transistor (Qf1) is connected to a first control signal (AGC1) at the base of the second feedback transistor (Qf1) and the third feedback transistor (Qf2) is connected to a second control signal (AGC2) at the base of the third feedback transistor (Qf2), and operate as switches.

Therefore, in the case where the second feedback transistor (Qf1) and the third feedback transistor (Qf2) are turned off by the first control signal (AGC1) and the second control signal (AGC2), respectively, the resistance value of the first feedback resistance (Rf0) becomes the total feedback resistance value, and thus a high gain is obtained. In the case where the second feedback transistor (Qf1) is turned on by the first control signal (AGC1) and the third feedback transistor (Qf2) is turned off by the second control signal (AGC2), the first feedback resistance (Rf0) is connected to the second feedback resistance (Rf1) in parallel, and thus the total feedback resistance value becomes smaller than the resistance value of the first feedback resistance (Rf0), and thus a low gain is obtained.

In the case where the second feedback transistor (Qf1) is turned off by a first external signal (AGC1) and the third feedback transistor (Qf2) is turned on by a second control signal (AGC2), the first feedback resistance (Rf0) is connected to the third feedback resistance (Rf2) in parallel, and the total resistance value becomes smaller than the resistance value of the first feedback resistance (Rf0), and thus a low gain is obtained. In the case where the second feedback transistor (Qf1) is turned on by the first control signal (AGC1) and the third feedback transistor (Qf2) is turned on by the second control signal (AGC2), the first feedback resistance (Rf0), second feedback resistance (Rf1), and third feedback resistance (Rf2) are all connected in parallel, and the total feedback resistance value becomes extremely smaller than the resistance value of the first feedback resistance (Rf0), and thus an extremely low gain is obtained. Herein, the second feedback resistance (Rf1) and the third feedback resistance (Rf2) may have a same value or different values from each other.

Meanwhile, when the second feedback resistance (Rf1) and third feedback resistance (Rf2) are reflected and thus the total feedback resistance value becomes low, the feedback amplifier 200 has a peak in a frequency response, and thus it will become necessary to planarize the frequency response. For this purpose, a first feedback capacitor (Cf1) connected to the second feedback resistance (Rf1) in parallel and a second feedback capacitor (Cf2) connected to the third feedback resistance (Rf2) in parallel are used, respectively. That is, the first feedback capacitor (Cf1) and the second feedback capacitor (Cf2) compensate the frequency response caused by a decrease of the total feedback resistance value.

Furthermore, the base of the first feedback transistor (Qf0) included in the feedback circuit 230 is connected to the base of the first bias transistor (Qb1) included in the bias circuit 240, and thus the operation of the first feedback transistor (Qf0) is fixed by the bias voltage (Vb) supplied from the bias circuit 240. That is, by the voltage level of the output terminal (OUT) determined by the bias voltage (Vb), the impedance between the collector and emitter of the first feedback transistor (Qf0) is adjusted.

Accordingly, when the input current (I_in) is small enough, the voltage level of the output terminal (OUT) would almost never go beyond the operating point (Q point), and thus the first feedback transistor (Qf0) would be under a turn off condition, and the collector and emitter of the first feedback transistor (Qf0) would be open. As a result, the feedback circuit 230 would consist of the total fixed resistance (the first feedback resistance (Rf0) value, or the parallel resistance value of the first feedback resistance (Rf0) and second feedback resistance (Rf1), or the parallel resistance value of the first feedback resistance (Rf0) and third feedback resistance (Rf2), or the parallel resistance value of the first feedback resistance (Rf0), second feedback resistance (Rf1), and third feedback resistance (Rf3) determined by the first control signal and second control signal) and the first feedback transistor (Qf0) resistance only, thereby operating as almost the same as a feedback amplifier that does not have an AGC (Auto Gain Control) function.

Therefore, the voltage of the output terminal (OUT) becomes almost the same as the multiplication of the total fixed resistance value (the first feedback resistance (Rf0), or the parallel resistance value of the first feedback resistance (Rf0) and second feedback resistance (Rf1), or the parallel resistance value of the first feedback resistance (Rf0) and the third feedback resistance (Rf2), or the parallel resistance value of the first feedback resistance (Rf0), second feedback resistance (Rf1), and third feedback resistance (Rf2) determined by the first control signal and second control signal) and the input current (I_in).

Furthermore, when the input current (I_in) increases enough, the voltage level of the output terminal (OUT) gradually becomes lower than the operating point (Q-point), thereby turning on the first feedback transistor (Qf0). Accordingly, the first feedback transistor (Qf0) becomes conductive, thereby reducing the impedance between the collector and emitter. As a result, the total impedance of the feedback circuit 230 decreases, reducing the gain of the feedback amplifier 200 and performing the auto gain control operation.

More specifically, regarding the auto gain control operation, since the base of the first bias transistor (Qb1) is connected to the base of the feedback transistor (Qf0), a diode turn on voltage is applied to the feedback transistor (Qf0). Meanwhile, since the collector of the feedback transistor (Qf0) is connected to the base of the first transistor (Q1) of the amplifier circuit 210, a direct voltage level of a diode turn on voltage is applied to the collector of the feedback transistor (Qf0) as well. Accordingly, the base and collector of the feedback transistor (Qf0) have a similar direct voltage level. In such a direct state (operating point state), when the input current (I_in) increases, the voltage of the output terminal (OUT) will be reduced by a reverse amplification. Herein, since the output terminal and the emitter of the feedback transistor (Qf0) are connected to each other, the emitter voltage of the feedback transistor (Qf0) would become lower, turning on the feedback transistor (Qf0). Since the base and the collector of the feedback transistor (Qf0) have the same direct voltage level, the feedback transistor consequently has a structure where the case and collector are connected to each other, thereby performing a diode operation. Therefore, the bigger the current flows, the lesser the resistance is. Herein, the reason why the base and collector of the feedback transistor (Qf0) are not connected to each other is to adjust the turn on voltage of the feedback transistor with the bias voltage (Vb).

As aforementioned, since the total feedback resistance of the feedback circuit 230 (the total feedback resistance (Rf) being the first feedback resistance (Rf0) value, or the parallel resistance value of the first feedback resistance (Rf0) and second feedback resistance (Rf1), or the parallel resistance value of the first feedback resistance (Rf0) and third feedback resistance (Rf2), or the parallel resistance value of the first feedback resistance (Rf0), second feedback resistance (Rf1), and third feedback resistance (Rf2) determined by the first control signal and second control signal) and the feedback transistor (Qf0) are connected in parallel, assuming that the on resistance of the feedback transistor (Qf0) is RQf, the total impedance $Z_f$ of the feedback circuit 230 may be expressed as math formula 1 shown below.

$$Z_f = Rf \| RQf \quad \text{[Math formula 1]}$$

According to math formula 1, when the input current (I_in) increases, the on resistance (RQf) of the feedback transistor (Qf0) decreases, thereby reducing the total feedback impedance ($Z_f$) as well. Furthermore, the gain of the feedback circuit 230 may be expressed as math formula 2 shown below.

$$\text{gain} = \frac{V_{out}}{I_{in}} = -Z_j \quad \text{[Math formula 2]}$$

According to math formula 2, the gain of the feedback circuit 230 is a negative feedback impedance, and thus when the input current (I_in) increases, the gain of the feedback amplifier automatically decreases. Herein, the size of the minimum input current (I_in) necessary for the auto gain control operation to start is determined by the bias voltage applied to the base terminal of the feedback transistor (Qf0), and thus it is possible to freely set the size of the minimum input current (I_in) by adjusting the bias voltage (Vb).

Consequently, the voltage of the base terminal of the feedback transistor (Qf0) is fixed by the voltage that the bias circuit 240 supplies, and the size of the impedance between the collector and emitter of the feedback transistor (Qf0) is automatically adjusted by the voltage level of the output terminal (OUT) to which the emitter is connected, and thus an additional gain control signal generator circuit is not needed. Furthermore, as the input current (I_in) increases, the impedance of the feedback circuit 230 decreases, thereby automatically controlling the gain of the feedback amplifier circuit 200.

Accordingly, in the feedback amplifier 200 according to an embodiment of the present invention, with the total feedback resistance value determined by whether or not the second feedback transistor (Qf1) is open by the first control signal (AGC1) and whether or not the third feedback transistor (Qf2) is open by the second control signal (AGC2), the increase of the impedance of the feedback circuit 230 automatically controls the gain, and thus the feedback amplifier 200 operates while freely controlling the gain when there is a big difference in the input signal.

Hereinafter, an operation of the packet signal sensor 260 and fixed resistance controller 270 according to an embodiment of the present invention will be explained in detail.

The first comparator (Comp0) of the packet signal sensor 260 compares the output voltage (V_out) from the output terminal (OUT) with the minimum input level (Vref0).

If the output received from the output terminal (OUT) is bigger than the minimum input level (Vref0) defined of the first comparator (Comp0), the first comparator (Comp0) outputs a HIGH output, and if the output received from output terminal (OUT) is smaller than the minimum input level (Vref0) defined of the first comparator (Comp0), the first comparator (Comp0) outputs a LOW output. The HIGH/LOW output signal of the first comparator (Comp0) is a fixed resistance control signal that controls a turn on operation and turn off operation of the fixed resistance transistor (Qd).

If the output of the first comparator (Comp0) is HIGH, the fixed resistance transistor (Qd) of the fixed resistance controller 270 would be turned off, and the fixed resistance (Rf0) would be selected, and the input signal would be detected from the minimum level to the maximum level, and if the output of the first comparator (Comp0) is LOW, the fixed resistance transistor (Qd) would be turned on, and the fixed resistance (Rf0) would be removed.

As such, according to the output of the first comparator (Comp0) of the packet signal sensor 260, the fixed resistance transistor (Qd) would be turned on or turned off, thereby maintaining the fixed resistance (Rf0) to the value set in the fixed resistance (Rf0) or to 0. That is, if the output of the first comparator (Comp0) is HIGH, the fixed resistance transistor (Qd) would be turned off, maintaining the fixed resistance (Rf0) to the set value. On the other hand, if the output of the first comparator (Comp0) is LOW, the fixed resistance transistor (Qd) would be turned on, and the fixed resistance (Rf0) would become a short (having the value of 0).

By such an operation of the packet signal sensor 260 and fixed resistance controller 270, it is possible to expand the range of the receiving level of an input signal from a low input signal to a high input signal.

After detecting an input signal by the packet signal sensor 20 and fixed resistance controller 270 according to an embodiment of the present invention, it is possible to automatically control the gain (V_out/I_in) by the feedback circuit 230 according to the size of the detected signal.

Figure 3:
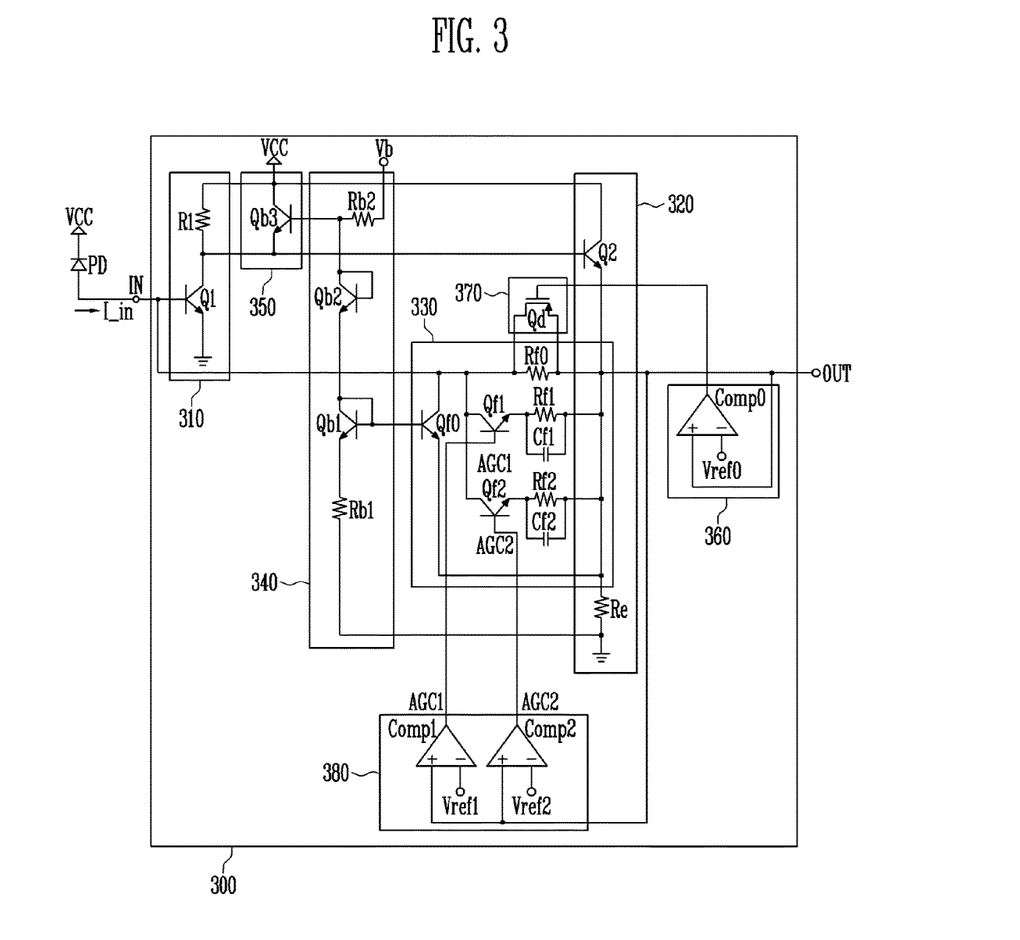
FIG. 3 is a view illustrating a feedback amplifier according to another embodiment of the present invention.

FIG. 3 is a view illustrating a feedback amplifier according to another embodiment of the present invention.

Referring to FIG. 3, the feedback amplifier 300 is connected between an input terminal (IN) and output terminal (OUT), and the input terminal (IN) is electrically connected to a power source (VCC), and a photodiode (PD) is connected between the input terminal (IN) and power source (VCC). Accordingly, the photodiode (PD) detects an input voltage. Furthermore, a cathode current (I_in) of the photodiode (PD) becomes an input current (I_in) of the feedback amplifier 300, and the input current (I_in) is provided to the feedback amplifier 300 through the input terminal (IN).

The feedback amplifier 300 includes an amplifier circuit 310, output circuit 320, feedback circuit 330 and bias circuit 340, packet signal sensor 360, fixed resistance controller 370, and control signal generator 380. Furthermore, the feedback amplifier 300 may further include a phase compensation circuit 350.

The feedback amplifier 300 is similar to the feedback amplifier 200 of FIG. 2 except for the control signal generator 380 for generating a first control signal (AGC1) and second control signal (AGC2). The first control signal (AGC1) and second control signal (AGC2) are applied to the feedback circuit 330. Therefore, the configuration other than the control signal generator 380 is the same as the configuration of the feedback amplifier 200 of FIG. 2.

The control signal generator 380 includes a second comparator (Comp1) and third comparator (Comp2).

The second comparator (Comp1) receives an output (V_out) from the output terminal (OUT) and compares it with a first reference voltage level (Vref1) defined of the second comparator (Comp1). The output (control signal (AGC1)) of the second comparator (Comp1) is connected to a second feedback transistor (Qf1) base of the feedback circuit 330.

The third comparator (Comp2) receives an output (V_out) from the output terminal (OUT) and compares it with a second reference voltage level (Vref2) defined of the third comparator (Comp2). The output (control signal (AGC2)) of the third comparator (Comp2) is connected to a third feedback transistor (Qf2) base of the feedback circuit 330.

An operation of the second comparator (Comp1) will be explained in detail hereinafter.

When the output (V_out) received from the output terminal (OUT) is bigger than the first reference voltage level (Vref1) defined of the second comparator (Comp1), the second comparator (Comp1) outputs a HIGH output, and when the output received from the output terminal (OUT) is smaller than the first reference voltage level (Vref1) defined of the second comparator (Comp1), the second comparator (Comp1) outputs a LOW output.

When the output of the second comparator (Comp1) is HIGH, the second feedback transistor (Qf1) of the feedback circuit 330 is turned on and a fixed resistance (Rf1) is selected, and when the output of the second comparator (Comp1) is LOW, the second feedback transistor (Qf1) is turned off, and the fixed resistance (Rf1) is removed.

As such, through an operation similar to the second comparator (Comp1), the third comparator (Comp2) outputs a HIGH output and LOW output through a comparison of the output from the output terminal (OUT) and the second reference voltage level (Vref2).

Through the aforementioned, when the output of the third comparator (Comp2) is HIGH, the third feedback transistor (Qf2) of the feedback circuit 330 is turned on, and a fixed resistance (Rf2) is selected, and when the output of the third comparator (Comp2) is LOW, the third feedback transistor (Qf2) is turned off, and the fixed resistance (Rf2) is removed.

The first reference voltage level (Vref1) and the second reference voltage level (Vref2) compared with the output from the output terminal (OUT) may have a same value, or different values from each other.

Figure 4:
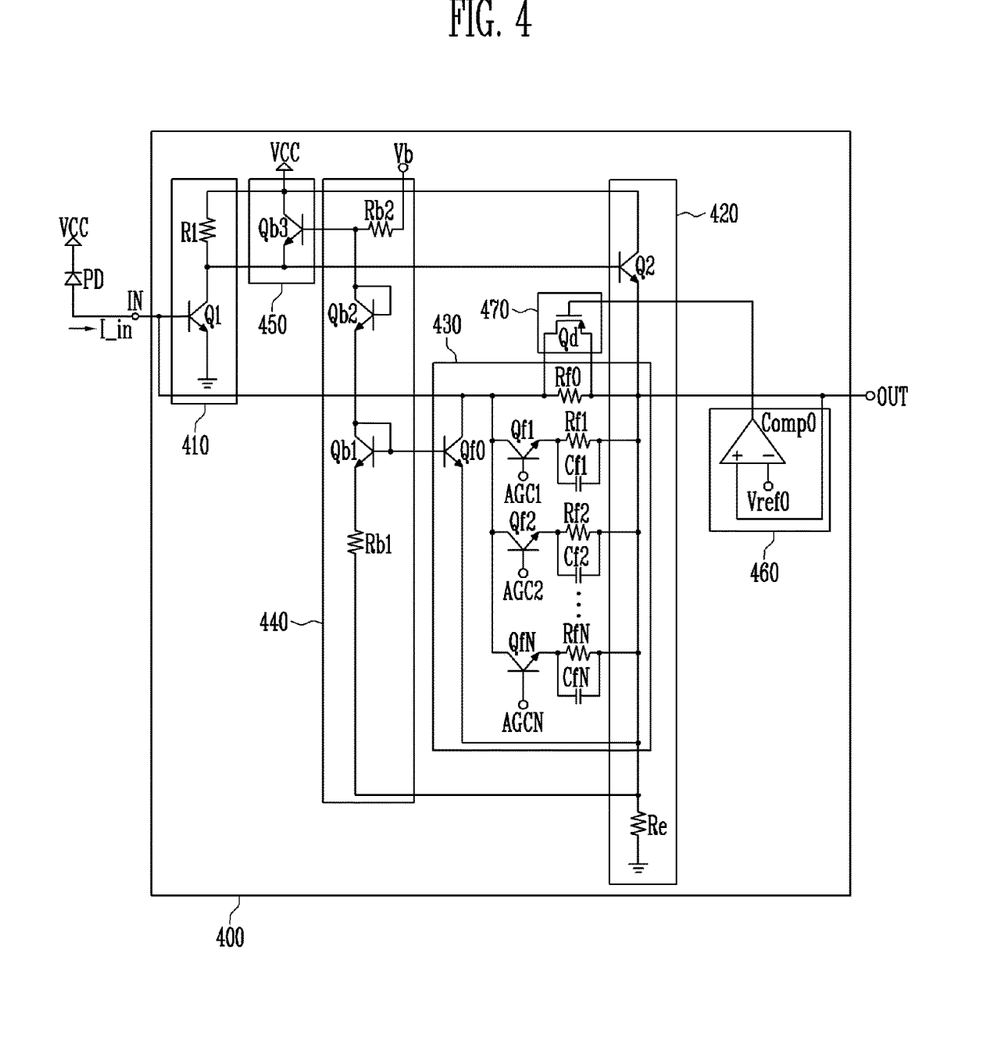
FIG. 4 is a view illustrating a feedback amplifier according to another embodiment of the present invention.

FIG. 4 is a view illustrating a feedback amplifier according to another embodiment of the present invention.

Referring to FIG. 4, the feedback amplifier 400 is connected between an input terminal (IN) and output terminal (OUT), and the input terminal (IN) is electrically connected to a power source (VCC), and a photodiode (PD) is connected between the input terminal (IN) and the power source (VCC). Accordingly, the photodiode (PD) detects an input voltage. Furthermore, a cathode current (I_in) of the photodiode (PD) becomes an input current (I_in) of the feedback amplifier, and the input current (I_in) is provided to the feedback amplifier 400 through the input terminal (IN).

The feedback amplifier 400 includes an amplifier circuit 410, output circuit 420, feedback circuit 430 and bias circuit 440, packet signal sensor 460, and fixed resistance controller 470. Furthermore, the feedback amplifier 400 may further include a phase compensation circuit 450.

The configuration of the feedback amplifier 400 is similar to the feedback amplifier 200 of FIG. 2 except that it further includes a plurality of feedback transistors (QfN), a plurality of feedback resistances (RfN), and a plurality of feedback capacitors (CfN) in the feedback circuit 430. Therefore, the configuration of the feedback amplifier 400 other than the feedback circuit 430 is the same as the configuration of the feedback amplifier 200 of FIG. 2.

The feedback circuit 430 includes the plurality of feedback resistances (Rf0, Rf1, Rf2, . . . , RFN), the plurality of feedback transistors (Qf0, Qf1, Qf2, . . . , QfN), and the plurality of feedback capacitors (Cf1, Cf2, . . . , CfN).

The first feedback resistance (Rf0) is connected between the input terminal (IN) and output terminal (OUT).

The first feedback transistor (Qf0) is connected to the first feedback resistance (Rf0) in parallel. A base of the first feedback transistor (Qf0) is connected to a bias circuit 240, that is a base of a first bias transistor (Qb1) included in the bias circuit 240, and the first feedback transistor (Qf0) receives a bias voltage (Vb) from the bias circuit 240. A collector of the first feedback transistor is connected to the input terminal (IN), and an emitter of the first feedback transistor (Qf0) is connected to the output terminal (OUT).

The second feedback transistor (Qf1) is connected to the first feedback resistance (Rf0) in parallel. A base of the second feedback transistor (Qf1) that adjusts a second feedback resistance (Rf1) value is connected to a control signal (AGC1), and a collector of the second feedback transistor (Qf1) is connected to the input terminal (IN), and an emitter of the second feedback transistor (Qf1) is connected to the second feedback resistance (Rf1).

The second feedback resistance (Rf1) is connected to the second feedback transistor (Qf1) in series.

The first feedback capacitor (Cf1) is connected to the second feedback resistance (Rf1) and second feedback resistance (Rf1) in parallel.

The third feedback transistor (Qf2) is connected to the first feedback resistance (Rf0) in parallel. A base of the third feedback transistor (Qf2) that adjusts a third feedback resistance (Rf2) value is connected to a control signal (AGC2), and a collector of the third feedback transistor (Qf2) is connected to the input terminal (IN), and an emitter of the third feedback transistor (Qf2) is connected to the third feedback resistance (Rf2).

The third feedback resistance (Rf2) is connected to the third feedback transistor (Qf2) in series.

The second feedback capacitor (Cf2) is connected to the third feedback resistance (Rf2) in parallel.

Furthermore, an N+1th feedback transistor (QfN) is connected to the first feedback resistance (Rf0) in parallel. A base of an N+1th feedback transistor (QfN) that adjusts an N+1th feedback resistance (RfN) value is connected to a control signal (AGC2), a collector of the N+1 feedback transistor (QfN) is connected to the input terminal (IN), and an emitter of the N+1th feedback transistor (QfN) is connected to the N+1th feedback resistance (RfN).

The N+1th feedback resistance (RfN) is connected to the N+1th feedback transistor (QfN) in series.

The Nth feedback capacitor (CfN) is connected to the N+1th feedback resistance (RfN) in parallel.

The feedback circuit 430 is configured such that feedback capacitors (Qf1 to QfN) that operate in response to a plurality of control signals (AGC1 to AGCN) are connected by a plurality of terminals.

Therefore, further operations of the feedback capacitors (Qf3 to Qfn), feedback resistors (Rf3 to RfN), and feedback capacitors (Cf3 to CfN) may be similar to the operations of the feedback capacitor (Qf1), feedback resistance (Rf1), and feedback capacitor (Cf1) of FIG. 2.

Figure 5:
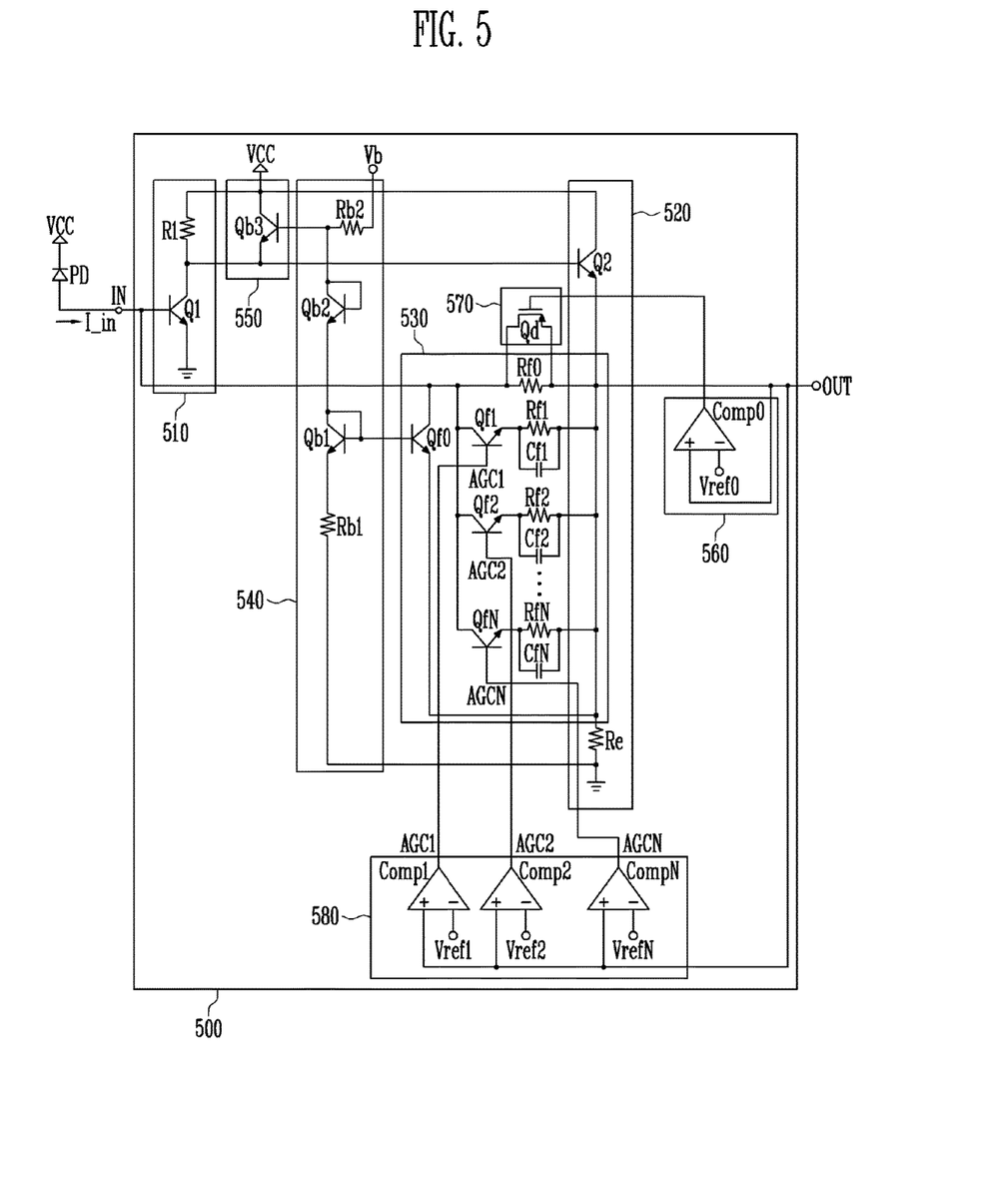
FIG. 5 is a feedback amplifier according to another embodiment of the present invention.

FIG. 5 is a view illustrating a feedback amplifier according to another embodiment of the present invention.

Referring to FIG. 5, the feedback amplifier 500 is connected between an input terminal (IN) and output terminal (OUT), and the input terminal (IN) is electrically connected to a power source (VCC), and a photodiode (PD) is connected between the input terminal (IN) and the power source (VCC). Accordingly, the photodiode (PD) detects an input voltage. Furthermore, a cathode current (I_in) becomes an input current (I_in) of the feedback amplifier 500, and the input current (I_in) is provided to the feedback amplifier 500 through the input terminal (IN).

The feedback amplifier 500 includes an amplifier circuit 510, output circuit 520, feedback circuit 530 and bias circuit 540, packet signal sensor 560, fixed resistance controller 570, and control signal generator 580. Furthermore, the feedback amplifier 500 may further include a phase compensation circuit 550.

The feedback amplifier 500 is different from the feedback amplifier 200 of FIG. 2 in that it further includes a plurality of feedback transistors (QfN), a plurality of feedback resistances (RfN), and a plurality of feedback capacitors (CfN) in the feedback circuit 430. Furthermore, the feedback amplifier 500 is also different from the feedback amplifier 200 of FIG. 2 in that it further includes a control signal generator 580 for generating control signals (AGC1, AGC2, ..., AGCN) to be applied to the plurality of feedback transistors that have been further included in the feedback circuit. Therefore, the configuration other than the aforementioned differences is the same as the configuration of the feedback amplifier 200 of FIG. 2.

The feedback circuit 530 includes the plurality of feedback resistances (Rf0, Rf1, Rf2, ..., RFN), plurality of feedback transistors (Qf0, Qf1, Qf2, ..., QfN), and plurality of feedback capacitors (Cf1, Cf2, ..., CfN).

The feedback circuit 530 has a similar structure as the feedback circuit 430 of FIG. 4. Therefore, for detailed structure of the feedback circuit 530, reference will be made to the feedback circuit 430 of FIG. 4.

Herein, the feedback circuit 530 is configured such that feedback capacitors (Qf1 to QfN) that operate in response to a plurality of control signals (AGC1 to AGCN) are connected by a plurality of terminals.

Therefore, the control signal generator 580 includes a plurality of comparators (Comp1, Comp2, ..., CompN) that generate a plurality of control signals (AGC1 to AGCN).

The second comparator (Comp1) receives an output (V_out) from the output terminal (OUT) and compares it with a first reference voltage level (Vref1) defined of the second comparator (Comp1). The output (control signal (AGC1)) of the second comparator (Comp1) is connected to a second feedback transistor (Qf1) base of the feedback circuit 330.

The third comparator (Comp2) receives an output (V_out) from the output terminal (OUT) and compares it with a second reference voltage level (Vref2) defined of the third comparator (Comp2). The output (control signal (AGC2)) of the third comparator (Comp2) is connected to a third feedback transistor (Qf2) base of the feedback circuit 330.

An N−1th comparator (CompN) receives an output (V_out) from the output terminal (OUT) and compares it with an Nth reference voltage level (VrefN) defined of the N−1th comparator (CompN). An output (control signal (AGCN)) of the N−1th comparator (CompN) is connected to an N+1th feedback transistor (QfN) of the feedback circuit 530.

Hereinafter, operations of the second comparator (Comp1) will be explained in detail.

When the output (V_out) received from the output terminal (OUT) is bigger than a first reference voltage level (Vref1) defined of the second comparator (Comp1), the second comparator (Comp1) outputs a HIGH output, and if the output received from the output terminal (OUT) is smaller than the first reference voltage level (Vref1) defined of the second comparator (Comp1), the second comparator (Comp1) outputs a LOW output.

When the output of the second comparator (Comp1) is HIGH, the second feedback transistor (Qf1) of the feedback circuit 330 is turned on and a fixed resistance (Rf1) is selected, and when the output of the second comparator (Comp1) is LOW, the second feedback transistor (Qf1) is turned off, and the fixed resistance (Rf1) is removed.

As such, through similar operations as the second comparator (Comp1), the third comparator (Comp2) (or the N−1th comparator (CompN)) outputs a HIGH output or LOW output after comparing an output from the output terminal (OUT) and a second reference voltage level (Vref2) (or an Nth reference voltage level (VrefN)).

Through the aforementioned, when the output of the third comparator (Comp2) (or an N−1th comparator (CompN)) is HIGH, the third transistor (Qf2)(or an N+1th feedback transistor (QfN)) of the feedback circuit 330 is turned on and a fixed resistance (Rf2)(or fixed resistance (RfN)) is selected, and when the output of the third comparator (Comp2)(or an N−1th comparator (CompN)) is LOW, the third feedback transistor (Qf2)(or an N+1th feedback transistor (QfN)) is turned off and a fixed resistance (Rf2)(or fixed resistance (RfN)) is removed.

Meanwhile, a first reference voltage level (Vref1) to Nth reference voltage level (VrefN) that are compared with the output from the output terminal (OUT) may all have the same value, or different values.

As such, in FIGS. 2 to 5 of the present invention, it is possible to expand the range of a receiving level of an input signal based on various structures of a feedback amplifier that are configured to control a resistance value of a feedback circuit using an output signal. Furthermore, by controlling an impedance of a feedback circuit according to an input current, it is possible to freely and automatically control a gain even when there is a big difference in an input signal.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A feedback amplifier comprising:
an amplifier circuit configured to amplify an input signal input from an input terminal and output the amplified input signal to an output terminal;
a feedback circuit disposed between the input terminal and the output terminal, and configured to determine a feedback resistance value to be applied to a signal output to the output terminal, and to control a gain of the amplifier circuit by adjusting the input signal on the basis of a bias voltage applied with the feedback resistance value determined;
a bias circuit configured to generate the bias voltage;
a packet signal sensor, including a comparator, configured to generate a fixed resistance control signal for controlling a fixed resistance value included in the feedback resistance value through a comparison between the output from the output terminal and a minimum signal level by the comparator, the packet signal sensor outputting the fixed resistance control signal having a HIGH output and a LOW output respectively in response to the output from the output terminal being bigger and smaller than the minimum signal level; and
a fixed resistance controller configured to control the fixed resistance value included in the feedback resistance value in response to the fixed resistance control signal.

2. The feedback amplifier according to claim 1, wherein the feedback circuit comprises:
a feedback transistor wherein its base receives the bias voltage, its collector is connected to the input terminal, and its emitter is connected to the output terminal;
a fixed resistance connected between the input terminal and the output terminal, and has the fixed resistance value; and
at least one feedback resistance connected to the fixed resistance in parallel.

3. The feedback amplifier according to claim 2, wherein the fixed resistance controller comprises a fixed resistance transistor made of a PNP bipolar transistor, and
an emitter of the fixed resistance transistor is connected to one end of the fixed resistance, a collector is connected to another end of the fixed resistance, the fixed resistance control signal is received through a base and whether or not to apply the fixed resistance value is determined, or the collector is connected to one end of the fixed resistance, the emitter is connected to the another end of the fixed resistance, and the fixed resistance control signal is received through the base and whether or not to apply the fixed resistance value is determined.

4. The feedback amplifier according to claim 2, wherein the fixed resistance controller comprises a fixed resistance transistor made of a PMOSFET (P Metal-Oxide-Semiconductor Field-Effect Transistor), and
a drain of the fixed resistance transistor is connected to one end of the fixed resistance, a source is connected to another end of the fixed resistance, and the fixed resistance control signal is received through a gate and whether or not to apply the fixed resistance value is determined, or the source is connected to one end of the fixed resistance, the drain is connected to another end of the fixed resistance, and the fixed resistance control signal is received through the gate and whether or not to apply the fixed resistance value is determined.

5. The feedback amplifier according to claim 2, wherein the feedback circuit further comprises a feedback capacitor connected to the at least one feedback resistance in parallel and configured to compensate a frequency response.

6. The feedback amplifier according to claim 2, wherein the feedback circuit further comprises another feedback transistor connected to the at least one feedback resistance in series and configured to selectively determine whether or not to apply a resistance value of the at least one feedback resistance connected in series as the feedback resistance value in response to a control signal applied to a base of the another feedback transistor.

7. The feedback amplifier according to claim 6, further comprising a control signal generator configured to compare an output from the output terminal with a reference voltage level and generate the control signal.

8. The feedback amplifier according to claim 7, wherein the control signal generator includes a comparator corresponding to the feedback transistor, and configured to compare the output from the output terminal with a reference voltage level, and in response to the output from the output terminal being bigger than the reference voltage level, to output the control signal having another HIGH output, and in response to the output from the output terminal being smaller than the reference voltage level, to output the control signal having another LOW output.

9. The feedback amplifier according to claim 1, wherein the amplifier circuit comprises:
a first resistance connected to a power source voltage;
a first transistor wherein its base is connected to the input terminal, its emitter is connected to a grounding terminal, and its collector is connected to the power source voltage through the first resistance;

a second transistor wherein its base is connected to the collector of the first transistor, its collector is connected to the power source voltage, and its emitter is connected to the output terminal; and a second resistance connected between the output terminal and grounding terminal.

10. The feedback amplifier according to claim 9, further comprising a phase compensation circuit configured to prevent a distortion of an output wave form being caused by an increase of feedback current amount between the amplifier circuit and the bias circuit.

11. The feedback amplifier according to claim 10, wherein the bias circuit includes a bias transistor, and the phase compensation circuit comprises a compensation transistor wherein its collector is connected to the power source voltage, its base is connected to a collector of the bias transistor, and its emitter is connected to a collector of the first transistor.

* * * * *